United States Patent
Winokur et al.

(10) Patent No.: US 10,599,247 B2
(45) Date of Patent: Mar. 24, 2020

(54) THERMAL COMPENSATION FOR FORCE-SENSITIVE BUTTON

(71) Applicant: Apple Inc., Cupertino, CA (US)

(72) Inventors: Eric S. Winokur, San Francisco, CA (US); Robert Leo Sheridan, Sunnyvale, CA (US); Leah M. Gum, Los Gatos, CA (US); Sora Kim, Sunnyvale, CA (US); Giovanni Gozzini, Berkeley, CA (US)

(73) Assignee: Apple Inc., Cupertino, CA (US)

( * ) Notice: Subject to any disclaimer, the term of this patent is extended or adjusted under 35 U.S.C. 154(b) by 263 days.

(21) Appl. No.: 15/257,831

(22) Filed: Sep. 6, 2016

(65) Prior Publication Data

US 2018/0067601 A1  Mar. 8, 2018

(51) Int. Cl.
  *G06F 3/044* (2006.01)
  *G06F 3/041* (2006.01)
  (Continued)

(52) U.S. Cl.
  CPC ............ *G06F 3/0414* (2013.01); *G01K 3/10* (2013.01); *G06F 3/044* (2013.01); *G06F 3/0418* (2013.01);
  (Continued)

(58) Field of Classification Search
  None
  See application file for complete search history.

(56) References Cited

U.S. PATENT DOCUMENTS

| 5,483,261 A | 1/1996 | Yasutake |
| 5,488,204 A | 1/1996 | Mead et al. |

(Continued)

FOREIGN PATENT DOCUMENTS

| JP | 2000-163031 A | 6/2000 |
| JP | 2002-342033 A | 11/2002 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.
(Continued)

*Primary Examiner* — Brian M Butcher
(74) *Attorney, Agent, or Firm* — Brownstein Hyatt Farber Schreck, LLP

(57) ABSTRACT

Thermal compensation can be applied to force measurements of a force-sensitive button. A temperature differential between an object and the force-sensitive button can result in changes in the reconstructed force by the force sensor due to thermal effects rather than actual user force, which in turn can result in degraded performance of the force sensor (e.g., false positive or inconsistent activation force). In some examples, a force-sensitive button can include a force sensor configured to measure an amount of force applied to the force-sensitive button, and a temperature sensor configured to measure a temperature associated with the force sensor. The measured temperature can be used to compensate the amount of force measured by the force sensor based on the temperature associated with the force sensor. In some examples, the thermal compensation can be applied when an object is detected contacting the force-sensitive button (i.e., when rapid temperature differentials can occur).

13 Claims, 8 Drawing Sheets

(51) Int. Cl.
  *G01K 3/10* (2006.01)
  *H03K 17/975* (2006.01)
(52) U.S. Cl.
  CPC ......... *H03K 17/975* (2013.01); *G06F 3/0445* (2019.05); *G06F 2203/04105* (2013.01); *H03K 2217/9658* (2013.01)

(56) References Cited

U.S. PATENT DOCUMENTS

| | | |
|---|---|---|
| 5,825,352 A | 10/1998 | Bisset et al. |
| 5,835,079 A | 11/1998 | Shieh |
| 5,880,411 A | 3/1999 | Gillespie et al. |
| 6,188,391 B1 | 2/2001 | Seely et al. |
| 6,310,610 B1 | 10/2001 | Beaton et al. |
| 6,323,846 B1 | 11/2001 | Westerman et al. |
| 6,690,387 B2 | 2/2004 | Zimmerman et al. |
| 7,015,894 B2 | 3/2006 | Morohoshi |
| 7,184,064 B2 | 2/2007 | Zimmerman et al. |
| 7,663,607 B2 | 2/2010 | Hotelling et al. |
| 8,479,122 B2 | 7/2013 | Hotelling et al. |
| 9,383,282 B2 | 7/2016 | Besling et al. |
| 2006/0197753 A1 | 9/2006 | Hotelling |
| 2008/0165139 A1* | 7/2008 | Hotelling ............... G06F 3/041 345/173 |
| 2013/0018489 A1 | 1/2013 | Grunthaner et al. |
| 2016/0048266 A1* | 2/2016 | Smith .................. G06F 3/0418 345/174 |
| 2016/0062500 A1 | 3/2016 | Kessler et al. |

OTHER PUBLICATIONS

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

\* cited by examiner

THERMAL COMPENSATION FOR FORCE-SENSITIVE BUTTON

FIELD OF THE DISCLOSURE

This relates generally to force-sensitive inputs for electronic devices and, more specifically, to thermal compensation for force-sensitive buttons.

BACKGROUND OF THE DISCLOSURE

Many electronic devices include one or more input devices for receiving user inputs. Devices such as smart telephones, tablet computing devices, laptop computers, wearable communication and health devices, and navigation devices, and displays can include, or be connected to, an input device. For example, an input device can provide information to a computing system regarding user interaction with a graphical user interface (GUI), such as selecting elements, returning to a home page, and other GUI features. In another example, an input device can capture or receive biometric data associated with a user and provide such biometric data to a computing system.

One common input device in consumer electronic devices is a button. The conventional button can be a mechanical push button, such as a key, knob, and the like. The mechanical switch of the button can be activated or deactivated by a force applied to the button (i.e., binary input). In some cases, the mechanical switch can be replaced by a force sensor. The performance of a force sensor, however, can be degraded by thermal drift.

SUMMARY OF THE DISCLOSURE

This relates to thermal compensation for force-sensitive buttons according to examples of the disclosure. A temperature differential between an object (e.g., a finger) and the force-sensitive button can result in changes in the reconstructed force by the force sensor due to thermal effects rather than actual user force. As a result, without thermal compensation, the reconstructed force can result in degraded performance of the force sensor, including false positive button presses or clicks, or inconsistent force requirements to activate the force-sensitive button. In some examples, a force-sensitive button can include a force sensor (e.g., capacitive gap sensor) configured to measure an amount of force applied to the force-sensitive button, and a temperature sensor configured to measure a temperature associated with the force sensor. The measured temperature can be used to compensate the amount of force measured by the force sensor based on the temperature associated with the force sensor. In some examples, thermal compensation can be applied when an object is detected in contact with the force-sensitive button (e.g., when temperature differentials resulting in thermal drift typically occur). In some examples, the thermal compensation can include determining a measured gap based on the measured capacitance of a capacitive-gap force sensor, determining an estimated gap associated with a temperature change introduced into the force-sensitive button by the object touching the surface of the force-sensitive button based on the temperature associated with the force sensor (e.g., based on a thermal transfer function), determining a compensated gap by subtracting the estimated gap from the measured gap, and determining the compensated amount of force based on the compensated gap.

DETAILED DESCRIPTION

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

This relates to thermal compensation for force-sensitive buttons according to examples of the disclosure. A temperature differential between an object (e.g., a finger) and the force-sensitive button can result in changes in the reconstructed force by the force sensor due to thermal effects rather than actual user force. As a result, without thermal compensation, the reconstructed force can result in degraded performance of the force sensor, including false positive button presses or clicks, or inconsistent force requirements to activate the force-sensitive button. In some examples, a force-sensitive button can include a force sensor (e.g., capacitive gap sensor) configured to measure an amount of force applied to the force-sensitive button, and a temperature sensor configured to measure a temperature associated with the force sensor. The measured temperature can be used to compensate the amount of force measured by the force sensor based on the temperature associated with the force sensor. In some examples, the thermal compensation can be applied when an object is detected in contact with the force-sensitive button (e.g., when temperature differentials resulting in thermal drift typically occur). In some examples, the thermal compensation can include determining a measured gap based on the measured capacitance of a capacitive-gap force sensor, determining an estimated gap associated with a temperature change introduced into the force-sensitive button by the object touching the surface of the force-sensitive button based on the temperature associated with the force sensor (e.g., based on a thermal transfer function), determining a compensated gap by subtracting the estimated gap from the measured gap, and determining the compensated amount of force based on the compensated gap.

Figure 1A:
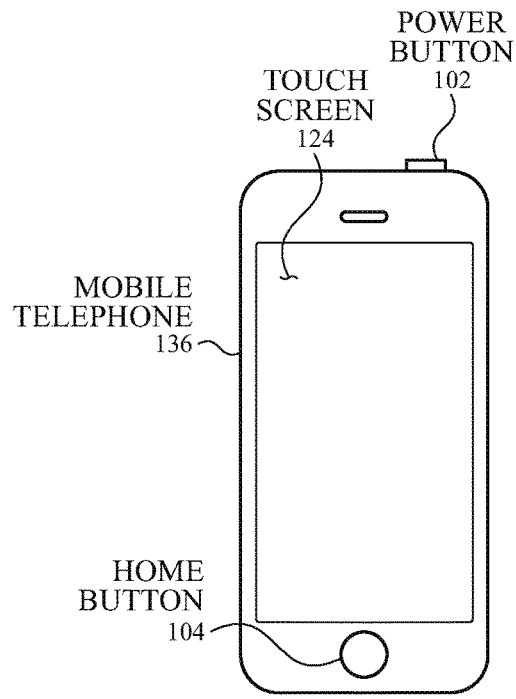
FIGS. 1A-1D illustrate examples of systems with a force-sensitive button that can implement thermal compensation according to examples of the disclosure.
Figure 1B:
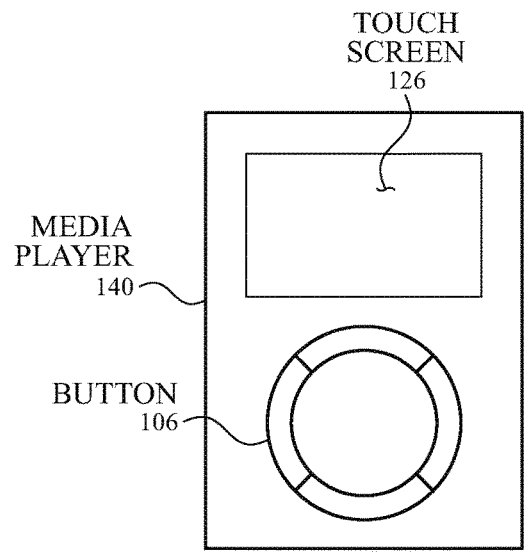
Figure 1C:
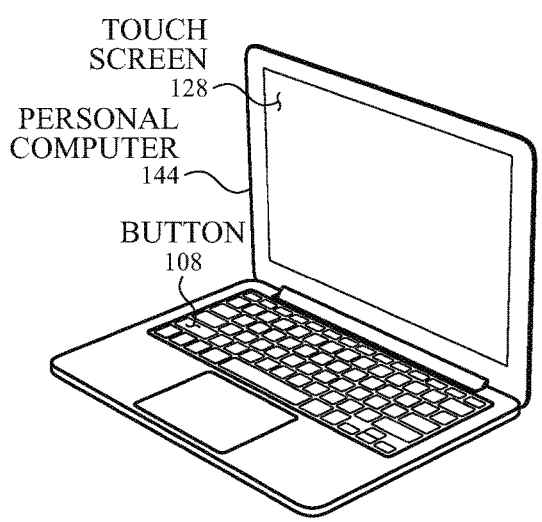
Figure 1D:
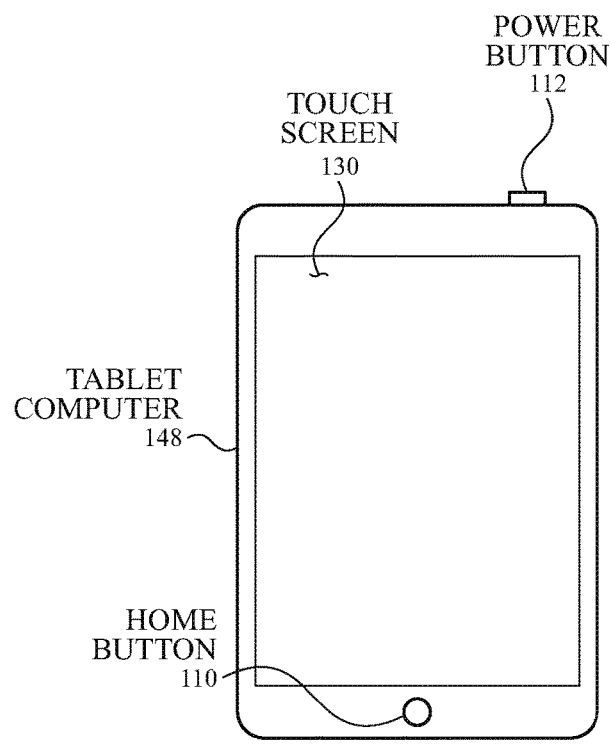

FIGS. 1A-1D illustrate examples of systems with a force-sensitive button that can implement thermal compensation according to examples of the disclosure. FIG. 1A illustrates an exemplary mobile telephone 136 that includes a touch screen 124, a force-sensitive button (e.g., power button 102, home button 104) and other computing system blocks that can implement thermal compensation according to examples of the disclosure. FIG. 1B illustrates an example digital media player 140 that includes a touch screen 126, a force-sensitive button (button 106) and other computing system blocks that can implement thermal compensation according to examples of the disclosure. FIG. 1C illustrates an example personal computer 144 that includes a touch screen 128, a force-sensitive button (e.g., button 108) and other computing system blocks that can implement thermal compensation according to examples of the disclosure. FIG. 1D illustrates an example tablet computing device 148 that includes a touch screen 130, a force-sensitive button (e.g., home button 110, power button 112) and other computing system blocks that can implement thermal compensation according to examples of the disclosure. The touch screen, force-sensitive button and other computing system blocks that can implement thermal compensation according to examples of the disclosure can be implemented in other devices including wearable devices.

Touch screens 124, 126, 128 and 130 can be based on, for example, self-capacitance or mutual capacitance sensing technology, or another touch sensing technology. For example, in a self-capacitance based touch system, an individual electrode with a self-capacitance to ground can be used to form a touch node (touch pixel) for detecting touch. As an object approaches the touch node, an additional capacitance to ground can be formed between the object and the touch node. The additional capacitance to ground can result in a net increase in the self-capacitance seen by the touch node. This increase in self-capacitance can be detected and measured by a touch sensing system to determine the positions of multiple objects when they touch the touch screen.

A mutual capacitance based touch system can include, for example, drive regions and sense regions, such as drive lines and sense lines. For example, drive lines can be formed in rows while sense lines can be formed in columns (i.e., orthogonal). Touch nodes can be formed at the intersections or adjacencies (in single layer configurations) of the drive regions and sense regions (e.g., rows and columns). During operation, the rows can be stimulated with an AC waveform and a mutual capacitance can be formed between the row and the column of the touch node. As an object approaches the touch node, some of the charge being coupled between the row and column of the touch node can instead be coupled onto the object. This reduction in charge coupling across the touch node can result in a net decrease in the mutual capacitance between the row and the column and a reduction in the AC waveform being coupled across the touch node. This reduction in the charge-coupled AC waveform can be detected and measured by the touch sensing system to determine the positions of multiple objects when they touch the touch screen. In some examples, a touch screen can be multi-touch, single touch, projection scan, full-imaging multi-touch, or any capacitive touch.

Figure 2:
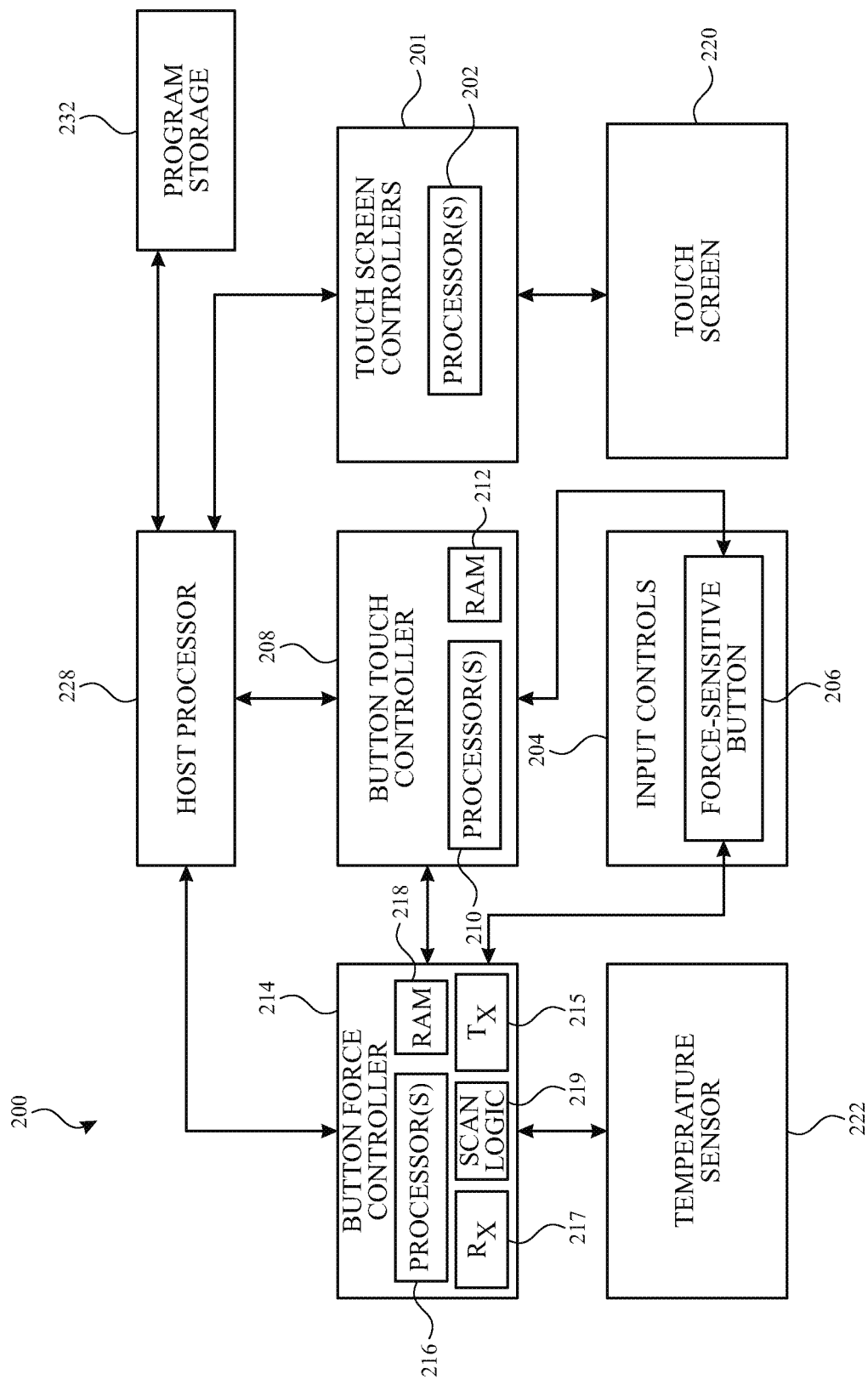
FIG. 2 illustrates a block diagram of an exemplary computing system including a force-sensitive button and capable of implementing thermal compensation according to examples of the disclosure.

FIG. 2 illustrates a block diagram of an exemplary computing system 200 including a force-sensitive button and capable of implementing thermal compensation according to examples of the disclosure. Computing system 200 could be included in, for example, mobile telephone 136, digital media player 140, personal computer 144, tablet computing device 148, wearable device, or any mobile or non-mobile computing device that includes a force-sensitive button. Computing system 200 can include an integrated touch screen 220 to display images and to detect touch and/or proximity (e.g., hover) events from an object (e.g., finger, passive stylus or active stylus) at or proximate to the surface of the touch screen 220. In some examples, touch screen 220 can also detect force applied by objects touching the surface. Computing system 200 can also include one or more application specific integrated circuits ("ASICs") to perform display, touch and/or stylus sensing, and force sensing operations. The display, touch and/or stylus sensing, and force sensing operations for touch screen 220 can be performed by one or more touch screen controllers 201. The one or more touch screen controllers 201 can include one or more processors 202.

The one or more touch screen controllers 201 can include a touch controller configured to perform touch and/or stylus sensing operations. The touch controller, one or more touch processors and peripherals can be implemented, for example, in a touch ASIC coupled to the touch screen 220. The peripherals can include, but are not limited to, random access memory (RAM) or other types of memory or storage, watchdog timers and the like. The touch controller can include, but is not limited to, receive circuitry (which can include one or more sense channels), panel scan engine (which can include channel scan logic), transmit circuitry (which can include analog or digital driver logic), and a charge pump. The transmit circuitry and receive circuitry can be reconfigurable, in some examples, by the panel scan engine based the scan event to be executed (e.g., mutual capacitance row-column scan, mutual capacitance row-row scan, mutual capacitance column-column scan, row self-capacitance scan, column self-capacitance scan, touch spectral analysis scan, stylus spectral analysis scan, stylus scan, etc.). The panel scan engine can access RAM, autonomously read data from the sense channels and provide control for the sense channels. The touch controller can also include a scan plan (e.g., stored in RAM) which can define a sequence of scan events to be performed at the touch screen 220. The scan plan can include information necessary for configuring or reconfiguring the transmit circuitry and receive circuitry for the specific scan event to be performed. Results (e.g., touch signals or touch data) from the various scans can also be stored in RAM. In addition, the panel scan engine can provide control for transmit circuitry to generate stimulation signals at various frequencies and/or phases that can be selectively applied to drive regions of the touch sensing circuitry of touch screen 220. The charge pump can be used to generate the supply voltage for the transmit circuitry. The touch controller can also include a spectral analyzer to determine low noise frequencies for touch and/or stylus sensing operations. The spectral analyzer can perform spectral analysis on the scan results from an unstimulated touch screen.

The one or more touch screen controllers 201 can include a display controller coupled to touch screen 220 and configured to perform display operations. The display controller can include hardware to process one or more still images and/or one or more video sequences for display on touch screen 220. The display controller can be configured to generate read memory operations to read the data representing the frame/video sequence from a memory through a memory controller, for example. The display controller can be configured to perform various processing on the image data (e.g., still images, video sequences, etc.). In some examples, the display controller can be configured to scale still images and to dither, scale and/or perform color space conversion on the frames of a video sequence. The display controller can be configured to blend the still image frames and the video sequence frames to produce output frames for display. The display controller can also be more generally referred to as a display pipe, display control unit, or display pipeline. The display control unit can be generally any hardware and/or firmware configured to prepare a frame for display from one or more sources (e.g., still images and/or video sequences). More particularly, the display controller can be configured to retrieve source frames from one or more source buffers stored in memory, composite frames from the source buffers, and display the resulting frames on touch screen 220. Accordingly, the display controller can be configured to read one or more source buffers and composite the image data to generate the output frame.

The display controller can provide various control and data signals to the display, including timing signals (e.g., one or more clock signals) and/or vertical blanking period and horizontal blanking interval controls. The timing signals can include a pixel clock that can indicate transmission of a pixel. The data signals can include color signals (e.g., red, green, blue). The display controller can control the touch screen 220 in real-time, providing the data indicating the pixels to be displayed as the touch screen is displaying the image indicated by the frame. The interface to such a touch screen 220 can be, for example, a video graphics array (VGA) interface, a high definition multimedia interface (HDMI), a digital video interface (DVI), a LCD interface, a plasma interface, or any other suitable interface.

Touch screen 220 can use liquid crystal display (LCD) technology, light emitting polymer display (LPD) technology, organic LED (OLED) technology, or organic electro luminescence (OEL) technology, although other display technologies can be used in other examples. In some examples, the touch sensing circuitry and display circuitry of touch screen 220 can be stacked on top of one another. For example, a touch sensor panel can cover some or all of a surface of the display (e.g., fabricated one on top of the next in a single stack-up or formed from adhering together a touch sensor panel stack-up with a display stack-up). In other examples, the touch sensing circuitry and display circuitry of touch screen 220 can be partially or wholly integrated with one another. The integration can be structural and/or functional. For example, some or all of the touch sensing circuitry can be structurally in between the substrate layers of the display (e.g., between two substrates of a display pixel cell). Portions of the touch sensing circuitry formed outside of the display pixel cell can be referred to as "on-cell" portions or layers, whereas portions of the touch sensing circuitry formed inside of the display pixel cell can be referred to as "in cell" portions or layers. Additionally, some electronic components can be shared, and used at times as touch sensing circuitry and at other times as display circuitry. For example, in some examples, common electrodes can be used for display functions during active display refresh and can be used to perform touch sensing functions during touch sensing periods. In some examples, a touch screen stack-up sharing components between sensing functions and display functions can be referred to as an in-cell touch screen.

As discussed above, the touch screen 220 can include touch sensing circuitry. In some examples, the touch sensing circuitry can configured as drive and sense regions or lines according to examples of the disclosure. For example, touch sensing circuitry can include a capacitive sensing medium having a plurality of drive lines and a plurality of sense lines. It should be noted that the term "lines" is sometimes used herein to mean simply conductive pathways, as one skilled in the art will readily understand, and is not limited to elements that are strictly linear, but includes pathways that change direction, and includes pathways of different size, shape, materials, etc. Additionally, the drive lines and sense lines can be formed from smaller electrodes coupled together to form drive lines and sense lines. Drive lines can be driven by stimulation signals from the transmit circuitry of the touch controller (e.g., through a drive interface), and resulting sense signals generated in sense lines can be received (e.g., through a sense interface) by sense channels in receive circuitry of the touch controller. In this way, drive lines and sense lines can be part of the touch sensing circuitry that can interact to form capacitive sensing nodes, which can be thought of as touch picture elements (touch pixels). This way of understanding can be particularly useful when the touch screen is viewed as capturing an "image" of touch. In other words, after the touch controller has determined whether a touch has been detected at each touch node (touch pixel) in the touch screen, the pattern of touch nodes (touch pixels) in the touch screen at which a touch occurred can be thought of as an "image" of touch (e.g., a pattern of fingers or other objects touching the touch screen).

Additionally or alternatively, the touch screen can include self-capacitance touch sensing circuitry including an array of self-capacitance electrodes. For example, the touch sensing circuitry can include a capacitive sensing medium having a plurality of electrically isolated touch node electrodes (or touch pixel electrodes). Touch node electrodes can be coupled to sense channels in receive circuitry of the touch controller, can be driven by stimulation signals from the sense channels and/or transmit circuitry (e.g., through drive/sense interface), and can be sensed by the sense channels (e.g., through the drive/sense interface). Labeling the conductive plates used to detect touch as "touch pixel" electrodes can be particularly useful when touch screen is viewed as capturing an "image" of touch. In other words, after the touch controller has determined an amount of touch detected at each touch pixel electrode in the touch screen, the pattern of touch pixel electrodes in the touch screen at which a touch occurred can be thought of as an "image" of touch (e.g., a pattern of fingers or other objects touching the touch screen).

The one or more touch screen controllers 201 can also include a force controller coupled to the touch screen 220 and configured to perform force sensing operations for the touch screen. The touch screen 220 can for example include an array of force sensors (e.g., capacitive, strain gauge, piezoelectric, piezoresistive, ultrasonic, magnetic, etc.) for detecting forces applied by objects on the surface of touch screen 220. The force controller can operate the force sensors and generate force data for touch screen 220.

Computing system 200 can also include a host processor 228 coupled to the one or more touch screen controllers 201. Host processor 228 can receive outputs (e.g., touch and/or stylus sensing data) from the touch controller and outputs (e.g., force data) from the force controller (e.g., via one or more communication buses, such as an serial peripheral interface (SPI) bus, for example) and perform actions based on the outputs. Host processor 228 can also be connected to program storage 232 and the display controller. Host processor 228 can, for example, communicate with the display controller to generate an image on touch screen 220, such as an image of a user interface (UI), and can use the touch controller and the force controller to detect a touch on (or near) touch screen 220 and its associated force, such as a touch input to the displayed UI. The touch and/or force input can be used by computer programs stored in program storage 232 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 228 can also perform additional functions that may not be related to touch/force processing.

Additionally or alternatively, computing system 200 can include input controls 204 to provide user input (e.g., separately from touch screen 220). Input controls 204 can include various types of controls including switches, knobs, sliders, toggles, buttons, etc. As discussed above with respect to FIGS. 1A-1D, various devices can include, for example, a home button and/or a power button. In some examples, some or all of the input controls 204 can be coupled to the host processor.

In some examples, an input control can be force-sensitive. FIG. 2, for example, illustrates a force-sensitive button 206. The force-sensitive button can be a solid state button including one or more force sensors to replace a physical switching button. Computing system 200 can include a button force controller 214 coupled to the force-sensitive button 206. Button force controller 214 can operate the one or more force sensors (e.g., capacitive, strain gauge, etc.) of force-sensitive button 206. Although referred to as a force-sensitive button 206 and a button force controller 214, it should be understood that other types of force-sensitive input controls other than buttons can be used.

Button force controller 214 can include transmit circuitry 215 and receive circuitry 217. Button force controller 214 can also include one or more processors 216, memory such as RAM 218, and button force scan logic 219. Transmit circuitry 215 can include analog and/or digital drivers to generate and transmit stimulation signals to one or more electrodes of a capacitive-gap force sensor of force-sensitive button 206. Receive circuitry 217 can include sense channels coupled to one or more electrodes of a capacitive-gap force sensor of force-sensitive button 206 to receive signals generated in response to the stimulation signals from the transmit circuitry 215. The sense channel can include an analog front end (AFE) including a sense amplifier, one or more filters and an analog to digital converter. Button force scan logic 219 can be coupled to the transmit circuitry 215 and receive circuitry 217, and can be configured to operate the transmit circuitry 215 and receive circuitry 217. Results from force sensing can be stored in memory (e.g., RAM 218) and processed by the one or more processors 216. Button force controller 214 can be coupled to provide force information to host processor 228. For example, when a threshold level of applied force is detected, button force controller 214 can indicate a force event indicative of activation of force-sensitive button 206 to host processor 228, and host processor 228 can perform the functionality associated with actuating force-sensitive button 206. As described herein in more detail, button force controller 214 can also implement thermal compensation according to examples of the disclosure.

Computing system 200 can also include a temperature sensor 222. In some examples, temperature sensor 222 can be proximate to the one or more force sensors of force-sensitive button 206. In some examples, temperature sensor 222 can be part of button force controller 214 or button touch controller 208. As described in more detail herein, the temperature sensor 222 can measure changes in temperature due to an object, such as a finger, touching the force-sensitive button 206, which can cause thermal drift in the one or more force sensors and degrade performance of the force-sensitive buttons. As described in more detail herein, the measurements from temperature sensor 222 can be used to implement thermal compensation according to examples of the disclosure. In some examples, computing system 200 can include multiple temperature sensors, and thermal compensation as described herein can be performed using temperature sensor measurements from multiple temperature sensors. Temperature sensor 222 can measure the temperature of components of the force-sensitive button (e.g., rather than the finger on an exterior surface of the force-sensitive button).

Additionally or alternatively, in some examples, the input control can be touch-sensitive. For example, force-sensitive button 206 can also be touch-sensitive. The button can include one or more touch sensors. Computing system 200 can include a button touch controller 208 coupled to the button (e.g., force-sensitive button 206). Button touch controller 208 can operate the one or more touch sensors (e.g., capacitive, resistive, etc.) of the button. Although referred to as a button touch controller 208, it should be understood that other types of touch-sensitive input controls other than buttons can be used.

Button touch controller 208 can include one or more processors 210 and memory such as RAM 212. Button touch controller 208 can be coupled to provide touch information to button force controller 214 or host processor 228. For example, when an object is detected touching the surface of the button, button touch controller 208 can indicate a touch event indicative of an object touching the force-sensitive button 206 to button force controller 214, and button force controller 214 can perform force sensing and/or thermal compensation as described herein based on the touch information. Additionally or alternatively, the button touch controller can detect touch on the surface of the button to identify a user (e.g., a fingerprint sensor), and host processor 228 can unlock the home screen or authorize payments, for example, based on the identification of the user. In some examples, the processing of touch information and identification of a user based on the touch information can be performed by host processor 228.

In some examples, the button touch controller 208 and button force controller 214 can be integrated into one component (e.g. an ASIC). In some examples, the button touch controller 208 can be integrated with the touch screen touch controller and/or the button force controller 214 can be integrated with the touch screen force controller.

Note that one or more of the functions described herein can be performed by firmware stored in memory and executed by one or more processors in touch screen controllers 201, button touch controller 208 and button force controller 214, or stored in program storage 232 and executed by host processor 228. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding a signal) that can contain or store the program for use by or in connection with the instruction execution system, apparatus, or device. The non-transitory computer readable medium storage can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

It is to be understood that the computing system 200 is not limited to the components and configuration of FIG. 2, but can include other or additional components in multiple configurations according to various examples. Additionally, the components of computing system 200 can be included within a single device, or can be distributed between multiple devices.

Figure 3A:
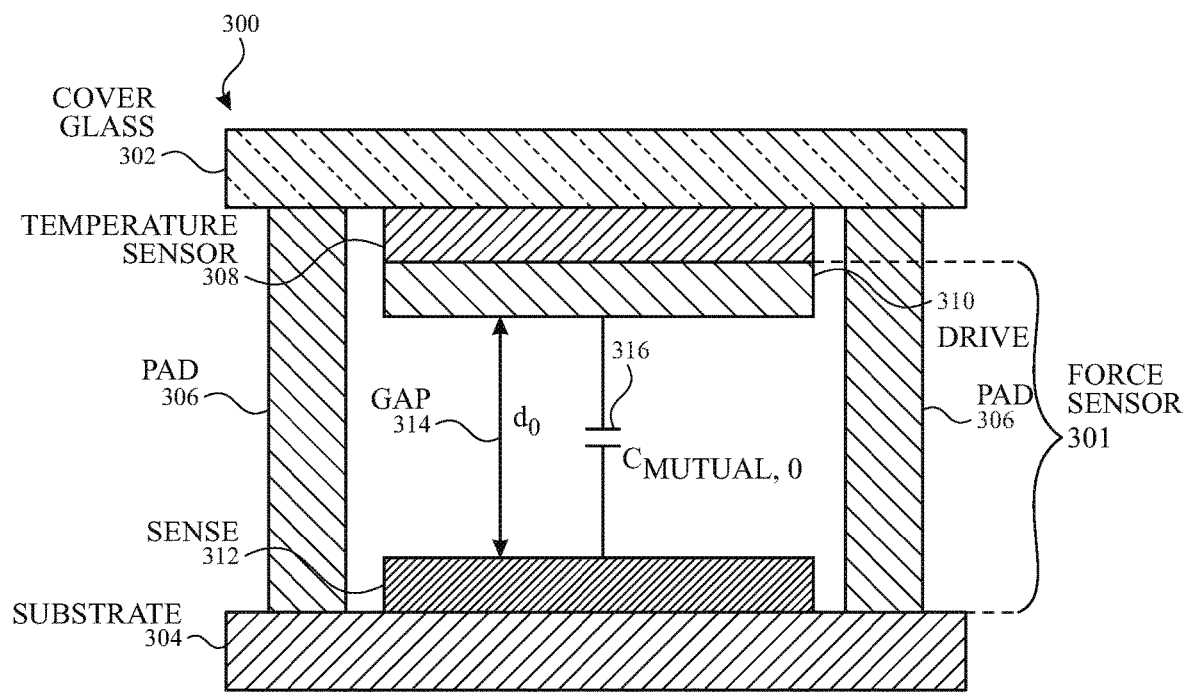
FIGS. 3A-3C illustrate an exemplary force-sensitive button according to examples of the disclosure.
Figure 3B:
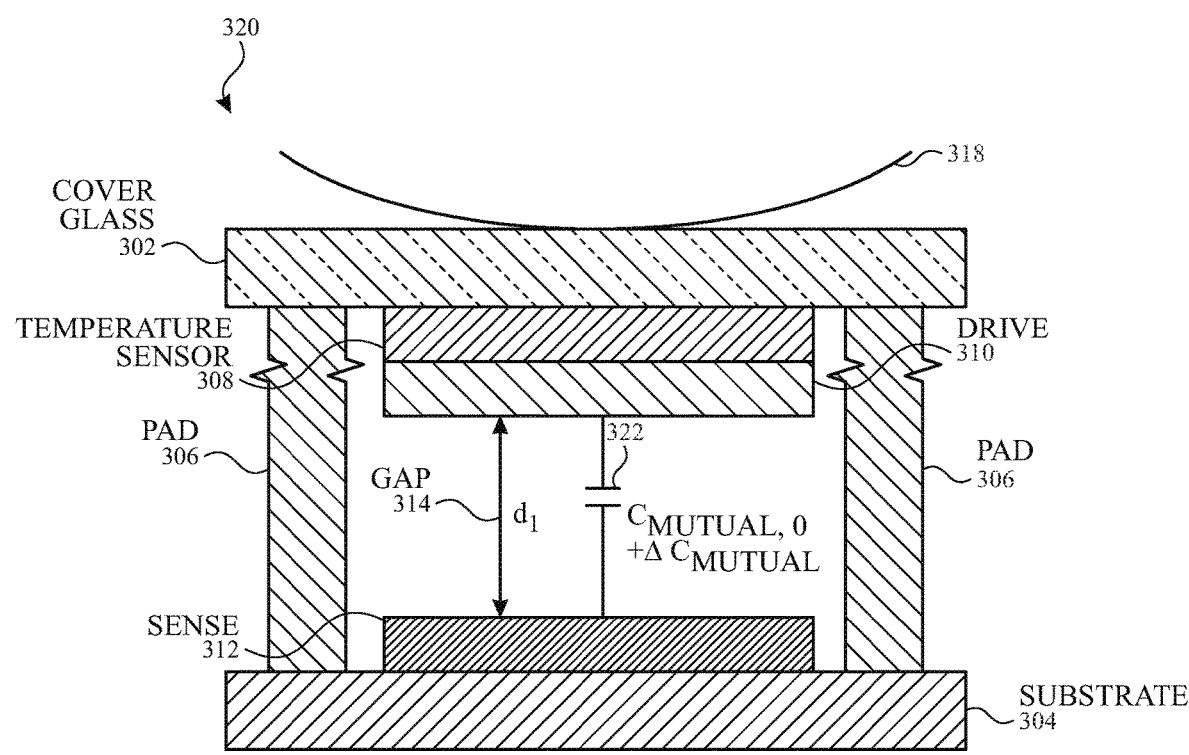
Figure 3C:
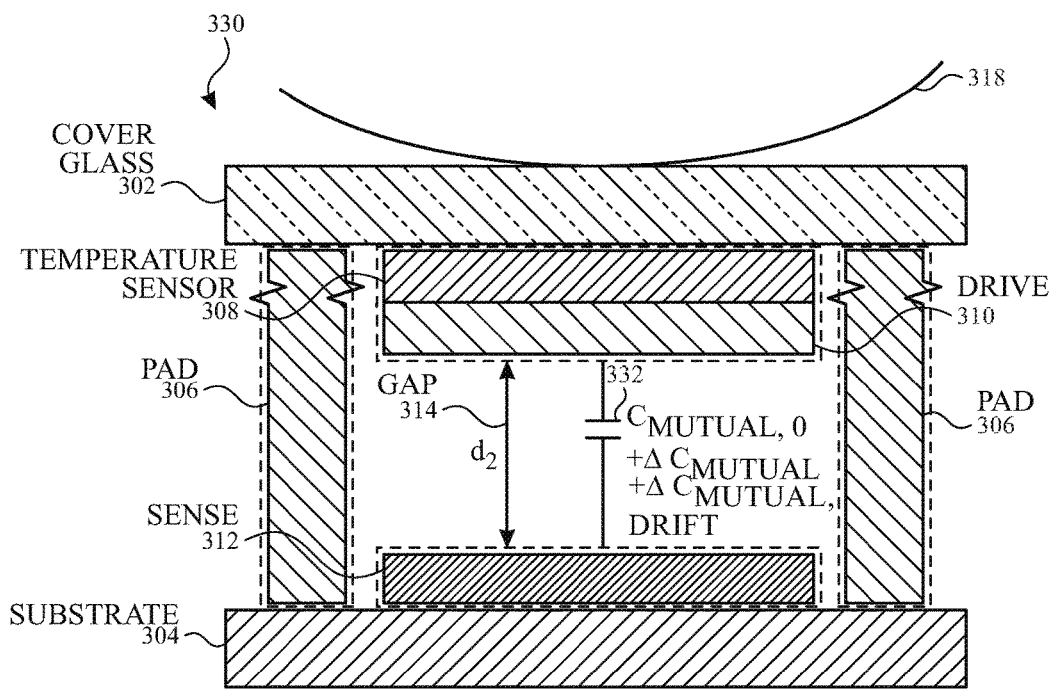

FIG. 3A-3C illustrate an exemplary force-sensitive button according to examples of the disclosure. FIG. 3A illustrates an exemplary stack-up 300 for a force-sensitive button before contact with a finger according to examples of the disclosure. The stack-up 300 for the force-sensitive button can include a cover glass 302 and a substrate 304. The cover glass 302 can be made, for example, of glass, sapphire crystal, or a plastic, and can form the external, user-facing surface of the force-sensitive button. The force-sensitive button can be a solid state button, unlike a conventional button that includes a physical switch. Pads 306 between the cover glass 302 and substrate 304 can provide for compressibility of the force-sensitive button. The force sensor 301 of the force-sensitive button can be a capacitive-gap force sensor including a drive layer 310 (e.g., one or more first electrodes) and a sense layer 312 (e.g., one or more second electrodes) separated by gap 314 (e.g., an air gap). In some examples, the drive layer 310 and the sense layer 312 can be separated by additional or alternative dielectric materials (e.g., silicon layer). The electrodes of the drive layer 310 and respective electrodes of the sense layer 312 can be aligned in at least one direction (e.g., vertically). A mutual capacitance 316 formed between the drive layer 310 and the sense layer 312 can be measured and used to determine an amount of force applied to the force-sensitive button. As illustrated in FIG. 3A, without a finger touching the force-sensitive button, the measured mutual capacitance can be a baseline mutual capacitance, $C_{mutual,0}$, indicative of no-force. Likewise, the corresponding baseline gap distance, $d_0$, can be indicative of no-force.

In some examples, the baseline gap distance and/or baseline mutual capacitance indicative of a no-force condition can be tracked (e.g., continuously, periodically, or in response to a triggering condition). Updating the baseline gap distance and/or baseline mutual capacitance can allow the system to account for thermal effects on the force sensor gap due to relatively slow temperature changes (e.g., in contrast to the relatively fast heat exchange that occurs when a finger is in contact with the force-sensitive button). For example, during a no-touch condition and no-force condition, the mutual capacitance and/or gap distance can be updated, and the updated baseline can be used for determining changes in capacitance and/or gap when an object is applying force (until the next baseline update).

The drive layer 310 can be mechanically coupled to the cover glass 302 and the sense layer 312 can be mechanically coupled to the substrate 304. The drive layer 310 and sense layer 312 can each include one or more electrodes. When the drive layer is driven by driving circuitry (e.g., transmit circuitry 215) during operation, the mutual capacitance formed between the one or more electrodes of the drive layer 310 and the one or more electrodes of the sense layer 312 can be measured by sensing circuitry (e.g., sensing circuitry 217). Changes in the gap due to an object applying force to the surface of cover glass 302 can cause compression of pads 306 and can reduce the gap between the drive layer 310 and the sense layer 312, thereby causing a change in mutual capacitance between the drive layer 310 and the sense layer 312. This change in mutual capacitance can be measured and used to determine an amount of force applied to the force-sensitive button.

Stack-up 300 can also include a temperature sensor 308 proximate to force sensor 301. As illustrated in FIG. 3A, the temperature sensor 308 can be coupled between the cover glass 302 and the drive layer 310 of force sensor 301. Although not shown in FIG. 3A, the stack-up 300 of the force-sensitive button can also include a touch sensor (e.g., a touch identification sensor).

FIG. 3B illustrates an exemplary stack-up 320 for a force-sensitive button when an object, such as a finger 318, applies a force to the surface of the force-sensitive button according to examples of the disclosure. The stack-up 320 for the force-sensitive button can be similar to the stack up of FIG. 3A, and the common description of the various elements is therefore omitted. Unlike in FIG. 3A, however, the force applied by object 318 on cover glass 302 can compress pads 306, thereby decreasing the gap between the drive layer 310 and the sense layer 312 of force sensor 301. As illustrated in FIG. 3C, the measured capacitance 322 formed between the drive layer 310 and sense layer 312 can be increased from the baseline mutual capacitance, $C_{mutual,0}$, to a measured capacitance $C_{mutual,0}+\Delta C_{mutual}$, where $\Delta C_{mutual}$ can represent the change in mutual capacitance due to the force applied by finger 318. Likewise, the corresponding measured gap distance, $d_1$, can decrease from the baseline gap distance, $d_0$, and the change in gap distance $(d_1-d_0)$ can be indicative of the amount of applied force.

FIG. 3C illustrates an exemplary stack-up 330 for a force-sensitive button including thermal effects due to temperature differences between an object, such as a finger 318, applying a force to the surface of the force-sensitive button and the force-sensitive button according to examples of the disclosure. The stack-up 330 for the force-sensitive button can be similar to the stack-ups of FIGS. 3A and 3B, and the common description of the various elements is therefore omitted. Unlike in FIGS. 3A and 3B, however, a temperature difference between finger 318 and the force-sensitive button can cause thermal expansion (or contraction) of materials in the stack-up 330, which can change gap 314 of the force sensor 301. For example, as illustrated in FIG. 3C, heat flux from finger 318 can cause expansion of materials (one or more of the materials) that can affect gap 314 of force sensor 301. In particular, expansion of pads 306 can increase gap 314 and expansion of drive layer 310 can decrease gap 314. As illustrated, the measured capacitance 332 formed between the drive layer 310 and sense layer 312 can be increased from the baseline mutual capacitance, $C_{mutual,0}$, to a measured capacitance $C_{mutual,0} + \Delta C_{mutual} \Delta C_{drift}$, where $\Delta C_{mutual}$ can represent the change in mutual capacitance due to the force applied by finger 318 and $\Delta C_{drift}$ can represent the change in mutual capacitance due to thermal drift. Likewise, the corresponding measured gap distance, $d_2$, can change from the baseline gap distance, $d_0$, and the change in gap distance ($d_2-d_0$) can be indicative of the amount of applied force and the thermal drift.

Figure 4:
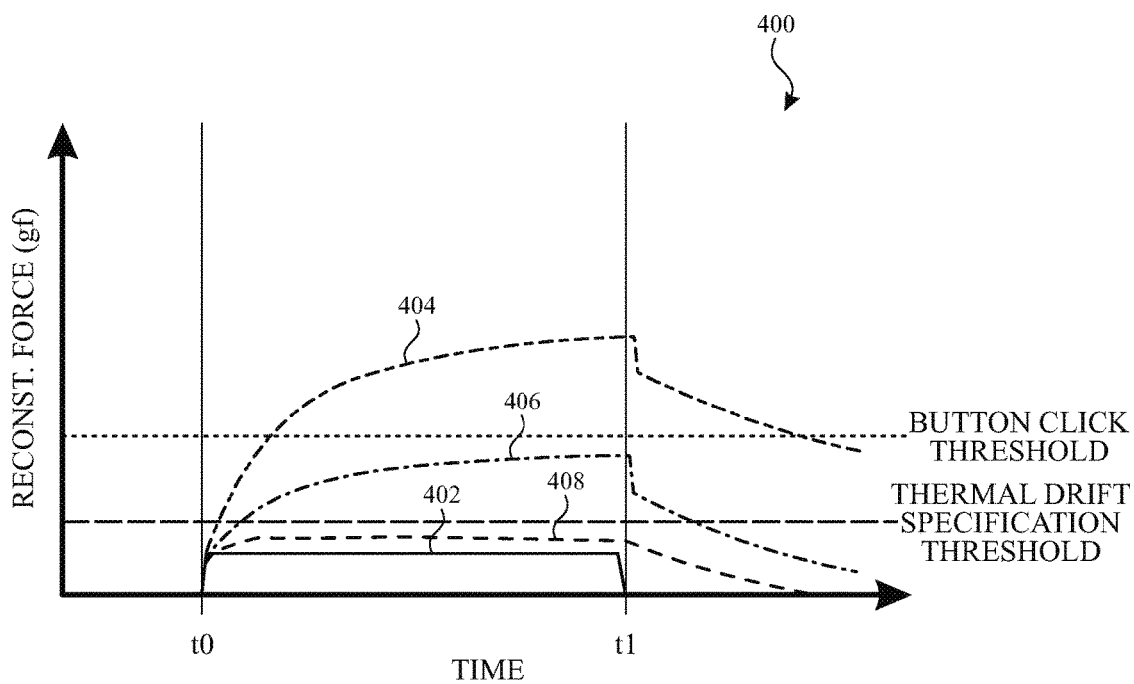
FIG. 4 illustrates an exemplary force versus time plot for a force-sensitive button according to examples of the disclosure.

Thermal drift of the force sensor due to temperature differentials between an object pressing a force-sensitive button and the force-sensitive button can degrade the performance of the force-sensitive button. FIG. 4 illustrates an exemplary force versus time plot for a force-sensitive button according to examples of the disclosure. Curve 402 can correspond to force applied to the surface of the force-sensitive button by a user's finger, for example. As illustrated in FIG. 4, the applied force of curve 402 can begin (ramp up) at t0 and end (after ramp down) at t1. The total user-applied force illustrated in FIG. 4 is approximately 25% of the threshold force indicative of button press or click. As a result, a button press or click should not be reported based on this user-applied force. Curve 404 can correspond to the reconstructed force based on capacitive-gap sensor measurements including thermal drift due to a temperature differential. The user's finger can be at body temperature and the force-sensitive button can be at a lower environmental temperature. Heat transfer between the finger and the button (due to a temperature difference therebetween) can occur quickly (e.g., within 100 ms). As a result of the temperature difference, a thermal drift can be introduced in the force measurement. As illustrated in FIG. 4, the thermal drift can cause the reconstructed force measured by curve 404 to exceed the button click threshold, resulting in a false positive button click. Even if the button click threshold is not exceeded due to the thermal drift, the thermal drift can result in an inconsistent user experience, where in some instances the same user-applied force can trigger a button click and in other instances it does not trigger a button click.

In some examples, thermal compensation can be implemented to reduce the effects of thermal drift. Curve 406 can correspond to the reconstructed force based on capacitive-gap sensor measurements including thermal drift due to a temperature differential after a first-order thermal compensation according to examples of the disclosure. Curve 408 can correspond to the reconstructed force based on capacitive-gap sensor measurements including thermal drift due to a temperature differential after a second-order thermal compensation according to examples of the disclosure. As illustrated by curve 406 and curve 408, the reconstructed force can be reduced by thermal compensation. In curve 406, the reconstructed force including thermal drift can be below the button press or click threshold, and therefore false positive button clicks can be reduced. However, the proximity of curve 406 to the button click threshold can still result in inconsistent performance because curve 406 is so close to the button press or click threshold. In curve 408, the reconstructed force including thermal drift can be below a thermal drift specification threshold. The thermal drift specification threshold can be a design specification for performance of the force-sensitive button. Within the thermal drift specification the button press or click performance can be within the design specification (e.g., below a threshold rate of false positives).

It should be understood that FIG. 4 assumes the temperature differential is caused by a finger that is hotter than the force-sensitive button. However, thermal compensation can be applied even when the temperature differential between the finger and the button reverses (i.e., the finger can be colder than the force-sensitive button. When the temperature differential reverses, then corresponding thermal contraction can have an impact on the gap in the opposite direction to that illustrated in FIG. 4.

Figure 5:
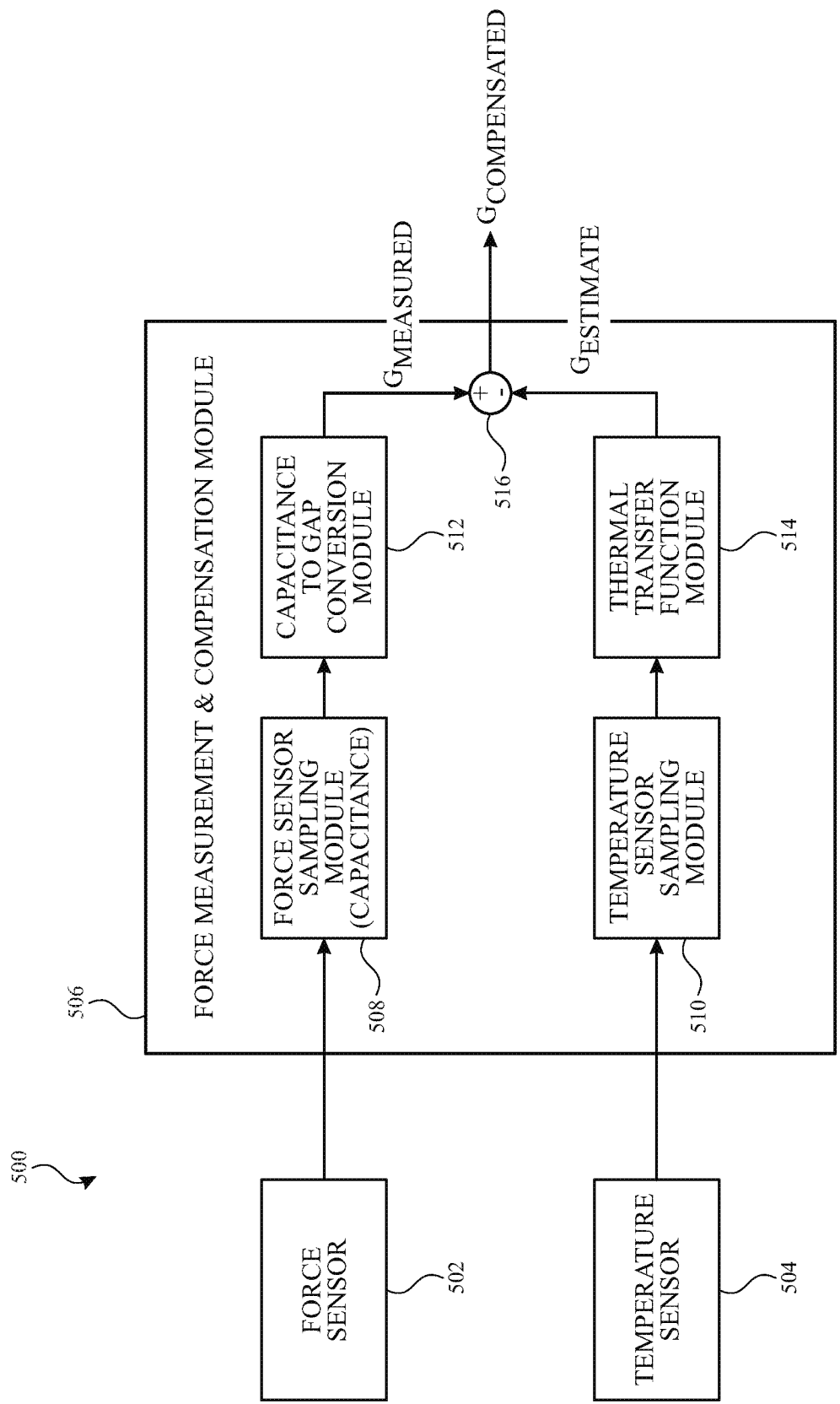
FIG. 5 illustrates an exemplary block diagram for thermal compensation according to examples of the disclosure.

As described above, thermal compensation can be applied to reduce the effects of thermal drift on a force-sensitive button. FIG. 5 illustrates an exemplary block diagram for thermal compensation according to examples of the disclosure. Block diagram 500 includes a force sensor 502 (e.g., corresponding to force sensor 301) and a temperature sensor 504 (e.g., corresponding to temperature sensor 308) and a force measurement and compensation module 506 (e.g., corresponding to button force controller 214). The force measurement and compensation module 506 can include hardware, software, firmware or a combination thereof configured to measure force and compensate force measurements for thermal drift. Force sensor 502 can be sampled by force sensor sampling module 508 (e.g., receive circuitry 217) of force measurement and compensation module 506. For example, the sampling can be a measurement of the mutual capacitance formed between the drive and sense electrodes of a force sensor (or a change in mutual capacitance therebetween). The mutual capacitance (or change in mutual capacitance) can be converted into a gap measurement (e.g., gap 314) by capacitance-to-gap conversion module 512. Temperature sensor 504 can be sampled by temperature sensor sampling module 510 of force measurement and compensation module 506. The sampled temperature (or change in temperature) can be converted into a gap estimate (e.g., due to thermal drift) by thermal transfer function module 514. The thermal transfer function will be described in more detail below. In some examples, the temperature sensor can track a baseline temperature measurement (even when thermal compensation is disabled) so that transient temperature changes can be better detected, and associated thermal drift in force sensor measurements can be better compensated. In such examples, the temperature measured at temperature sensor 504 can be baselined to subtract the baseline temperature when determining changes in temperature of the force-sensitive button. Subtractor 516 can remove the estimated thermal gap contribution from the measured gap to extract the compensated gap. The compensated gap can represent the gap contribution attributable to actual force with the thermal drift component removed (or reduced). The amount of force applied to the sensor can be determined based on the compensated gap.

It should be understood that the baseline gap or capacitance (e.g., steady-state without an object touching the force-sensitive button) can be removed from the measured gap at different stages in the above block diagram. In some examples, the baseline gap can be removed from the compensated gap, or by capacitance-to-gap conversion module 512 or subtractor 516. In some examples, the baseline capacitance can be removed from the measured capacitance before conversion from capacitance-to-gap by capacitance-to-gap conversion module 512, or by force sensor sampling module 508.

In some examples, thermal compensation can be enabled/disabled under certain conditions. For example, the thermal compensation can be enabled when an object is detected at the surface of a force-sensitive button (e.g., by button touch controller 208) and disabled when an object is not detected at the surface of the force-sensitive button. Additionally, in some examples, force sensing of the force-sensitive button can also be disabled when no object is detected on the surface. In other examples, force sensing of the force-sensitive button can be enabled even when no object is detected to avoid lag in detecting force. When no object is detected on the surface, gap changes due to heating or cooling of the force sensor stack-up can be accounted for using baselining techniques. The heat transfer without a touch can occur relatively slowly (compared to the heat transfer rate when a touch is detected), and therefore by periodically adjusting the baseline gap and/or mutual capacitance measurements, the thermal effects in the absence of a touch can be reduced or removed. However, when an object, such as a finger, is touching the force-sensitive button, the rapid heat exchange due to the temperature differential between the finger and the force-sensitive button can rapidly change the force sensor gap (introducing thermal drift error in force measurements). Because the object is touching and/or pressing the button, the thermal effects cannot be reducing by adjusting the baseline without potentially removing gap changes associate with the actual force applied to the force-sensitive button.

In some examples, thermal compensation can be disabled in a low power state (e.g., when battery charge for a device including the force-sensitive button is below a threshold). In some examples, the thermal compensation can be disabled once the finger and touch sensor reach an equilibrium temperature (e.g., the temperature differential is less than a threshold amount). In some examples, thermal compensation can be enabled when a threshold temperature (or temperature differential/change) is detected. In some examples, thermal compensation can be disabled after a threshold period of time after detecting the object. It should be understood that these conditions are exemplary and other conditions can exist to enable or disable thermal compensation. It should further be understood that various combinations of the above conditions can be used. It should be understood that when thermal compensation is disabled, force sensing operations can continue and can include force sensor 502, force sensor sampling module 508, and capacitance-to-gap conversion module 512. The amount of force can be determined from the gap measurement (rather than the compensated gap). As discussed above, baseline maintenance (tracking) of the no-force, no-touch gap and/or mutual capacitance can still reduce the effects of slow thermal changes without the thermal compensation described herein with respect to rapid heat transfers from an object such as a finger.

As discussed above, the estimated gap attributed to thermal drift can be based on a thermal transfer function. The thermal transfer function can be derived empirically based on measurements. For example, an object (e.g., a probe) with a known temperature can be applied (without force) as an input to a force-sensitive button under test, and the output gap (or change in gap) for the force-sensitive button can be measured. The thermal transfer function can then be the ratio of the output gap to temperature. Expressed mathematically, the transfer function can be expressed as $$H_{thermal} = \frac{\text{Gap}}{T_M},$$

where gap can represent the measured gap (or change in measured gap) due to thermal effects and $T_M$ can represent the measured temperature (or change in measured temperature). In some examples, the thermal transfer function can be a first order transfer function, derived from the empirical data. The linear first order transfer function can be implemented using a look-up table with estimated gap values output based on an input temperature from the temperature sensor. In some examples, the linear first order transfer function can be implemented using a scaling parameter (e.g., $G_{estimate} = T_M \times C_1$, where $C_1$ can represent a constant scaling parameter). In some examples, the thermal transfer function can be a second order transfer function (e.g., including a temporal component), derived from the empirical data (e.g., as described below). The second order transfer function can be implemented using a look-up table with estimated gap values output from the table based on an input temperature. Whether a first or second order (or some other order) thermal transfer function is used, the thermal transfer function can be applied, for example, by thermal transfer function module 514.

The thermal transfer function can also be derived based on thermal circuit modeling. The model can be created based on thermal impedances (resistances and capacitances) for materials in the stack up. For example, the model can be based on a thermal resistance and thermal capacitance for the cover glass, drive layer, sense layer, pad(s), trim, finger, etc. For example, FIG. 7B illustrates a thermal circuit model for a force-sensitive button of FIG. 7A. The model can be simplified and/or simulated, and a simplified transfer function can be derived. For example, the transfer function for the simplified system can be represented by a one-zero, two-pole system. One pole can be associated with the time constant for the pad(s), and one pole can be associated with the drive stack (e.g., including the drive layer of the force sensor, touch sensor, etc.).

The second order transfer function can derived based on a number of assumptions. For example, the assumptions can include 1) that the finger uniformly heats the cover glass of the force-sensitive button, 2) that the measured temperature by the temperature sensor is approximately equal to the temperature of the cover glass, 3) that there are no inherent thermal delays in the thermal circuit other than a single RC time constant, and 4) that the thermal drift contribution from the sense layer can be negligible. As discussed above, the thermal drift effect on the gap measurement can be based on thermal expansion of the pads and the drive stack. The thermal effect on the gap can be represented mathematically by equation (1):

$$\text{Gap} = T_P \cdot CTE_P - T_D \cdot CTE_D \tag{1}$$

where Gap can correspond to the change in the gap of the capacitive-gap force sensor due to thermal effects, $T_P$ can represent the pad temperature, $T_D$ can represent the drive stack temperature, $CTE_P$ can represent the coefficient of thermal expansion for the pad, and $CTE_D$ can represent the coefficient of thermal expansion for the drive stack.

The temperature of the pads and the drive stack can be dependent (e.g., having a low-pass filter relationship) on the temperature measured by the temperature sensor. For example, the pad temperature and the drive stack temperature can be expressed mathematically by equations (2) and (3), respectively:

$$T_P = \frac{A_P \omega_P}{s + \omega_P} \cdot T_M \tag{2}$$

$$T_D = \frac{A_D \omega_D}{s + \omega_D} \cdot T_M \tag{3}$$

where $A_P$ and $A_D$ can be scalar constants, $\omega_P$ and $\omega_D$ can be frequency constants, and s can be a frequency domain variable. It should be understood that in systems with multiple temperature sensors. In some examples, one temperature sensor can be used to measure pad temperature and one temperature sensor can be used to measure the drive stack. These two temperatures can be used to generate an appropriate thermal transfer function. In some examples, multiple temperature sensors can be to generate a temperature measurement representative of the temperature inside the force-sensitive button (e.g., based on a weighted average, etc.), the thermal transfer function can be based on multiple temperature measurement.

After substituting equations (2) and (3) into equation (1) and rearranging terms, the thermal transfer function can be expressed mathematically by equation (4):

$$H_{thermal}(s) = \frac{Gap}{T_M} = \frac{(\omega_P A_P CTE_P - \omega_D A_D CTE_D)s + \omega_P \omega_D (A_P CTE_P - A_D CTE_D)}{(s + \omega_D)(s + \omega_P)} \tag{4}$$

As described above, the gap and temperature measurements can be empirically determined for a device during a calibration step (e.g., a factory calibration). The parameters—including $CTE_P$, $CTE_D$, $A_P$, $A_D$, $\omega_P$ and $\omega_D$—can have a range of potential values (e.g., to account for manufacturing tolerances of the force-sensitive button). A best fit for the empirically measured transfer function can be used to determine calibration values for the parameters. In some examples, the range of potential values for the above parameters and the empirically measured temperature can be stored in one or more look-up tables, and a best fit to the measured gap can be determined. In some examples, the best fit can be determined using a fitting algorithm, such as least squares, ordinary least squares, least sum squared error, least sum of squared residuals, etc. The parameters and/or the thermal transfer function can be stored in memory (e.g., RAM 218) and used for thermal compensation as described herein.

Figure 6:
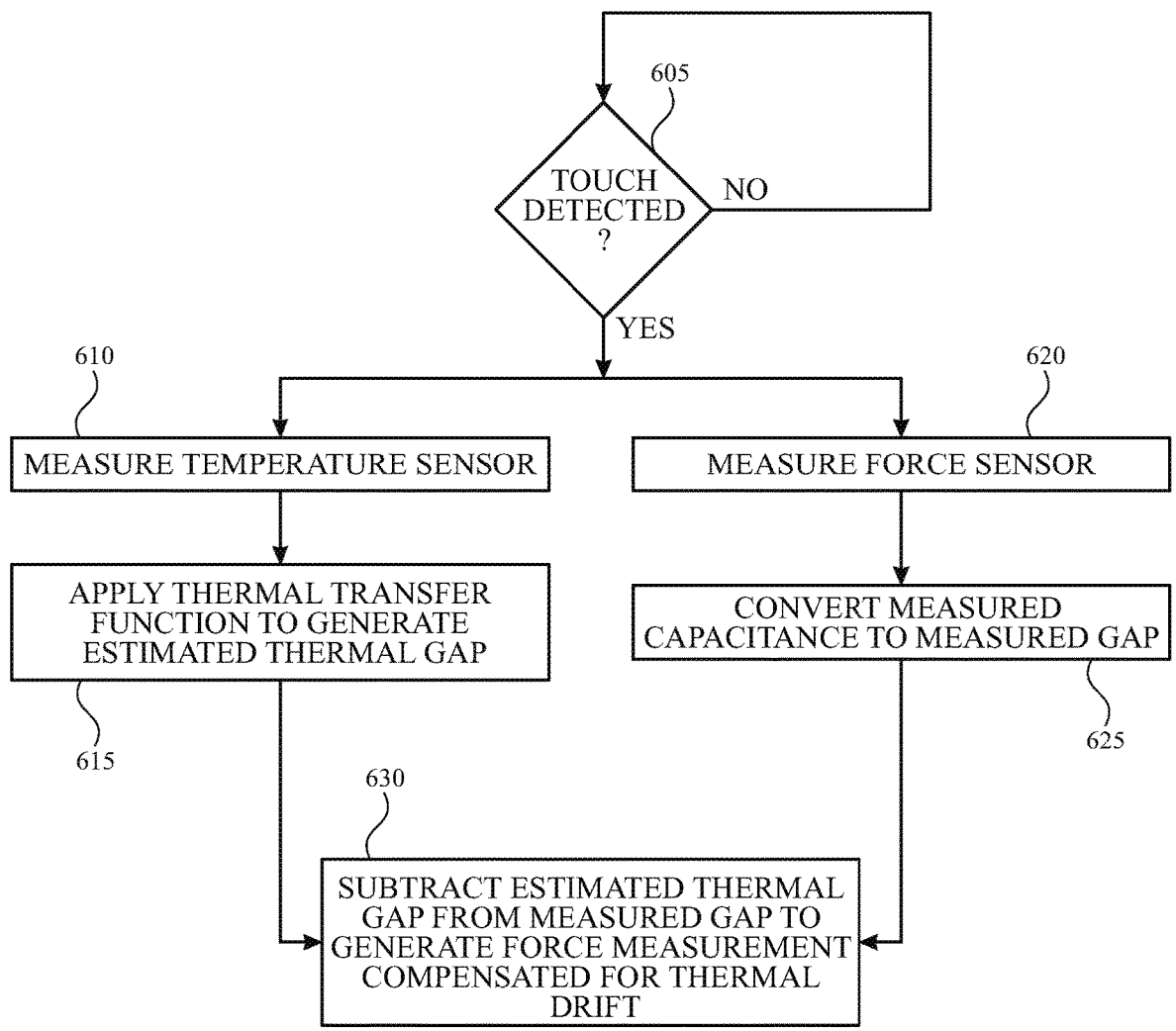
FIG. 6 illustrates an exemplary process for thermal compensation according to examples of the disclosure.

FIG. 6 illustrates an exemplary process for thermal compensation according to examples of the disclosure. At 605, the system (e.g., button force controller 214) can determine whether a touch has been detected at the surface of a force-sensitive button (e.g., by button touch controller 208). If touch is not detected, the system (e.g., button force controller 214) can forgo (e.g., disable) thermal compensation. Instead, the system can perform force sensing operation for the force-sensitive button without thermal compensation (e.g., based on the measured mutual capacitance or gap, and using updated baseline measurements). Additionally, the system (e.g., button force controller 214 and/or temperature sensor 222) can track a baseline temperature when no touch is detected. The tracked baseline temperature can be used for one or more of the temperature conditions described above for enabling/disabling thermal compensation. If touch is detected, the system can perform thermal compensation using force and temperature measurements (e.g., as described above with respect to FIG. 5). For example, at 610, the system can sample the temperature sensor. In some examples, whether a touch is detected or not, the temperature sensor sampling rate of the button can be the same (e.g., 40-60 Hz). In some examples, when thermal compensation is enabled, the temperature sensor sampling rate can increase relative to the baseline temperature sensor tracking sampling rate (e.g., increase from 1-10 Hz to 40-60 Hz). In some examples, the temperature sensor sampling rate can be the same as the force sensor sampling rate when thermal compensations is enabled. At 615, the system can apply the thermal transfer function to the temperature measurement to generate an estimated thermal gap. At 620, the system can sample the force sensor (e.g., measuring mutual capacitance). At 625, the system can convert the measured mutual capacitance to a measured gap. At 630, the system can subtract the estimated thermal gap from the measured gap to generate a force measurement compensated for thermal drift. In some examples, whether a touch is detected or not, the force sensor sampling rate of the button can be the same (e.g., 30 Hz, 40 Hz, 50 Hz, 60 Hz, etc.). In some examples, when touch is not detected, the force sensor sampling rate can be decrease relative to the force sensor sampling rate when touch is detected, or force sensor sampling can be disabled.

Figure 7A:
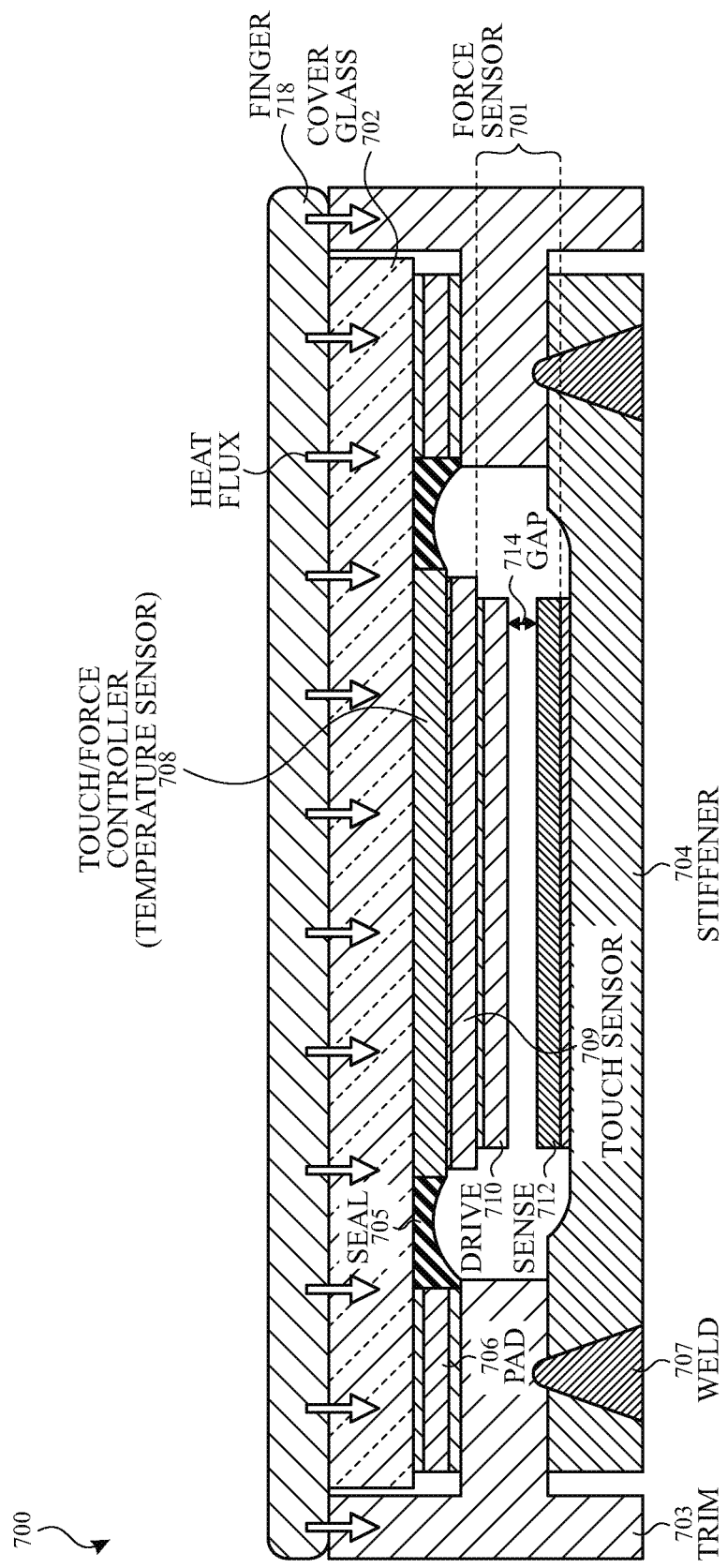
FIG. 7A illustrates an exemplary touch and force-sensitive button according to examples of the disclosure.
Figure 7B:
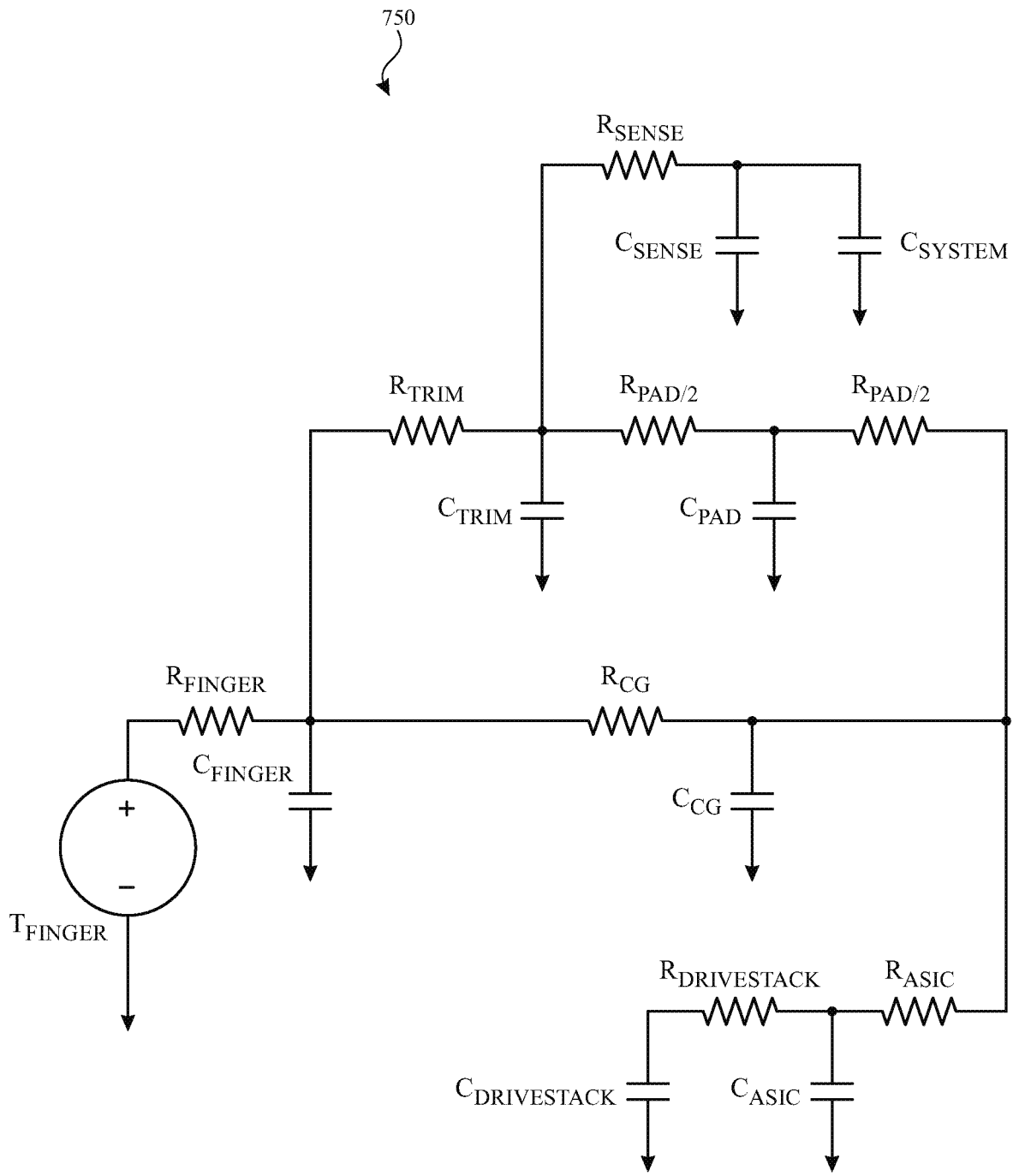
FIG. 7B illustrates an exemplary thermal circuit model for a touch and force-sensitive button according to examples of the disclosure.

FIG. 7A illustrates an exemplary touch and force-sensitive button according to examples of the disclosure. Touch and force-sensitive button 700 can be a solid state button, including an upper substrate, cover glass 702, and a lower substrate, stiffener 704 (e.g., corresponding to cover glass 302 and substrate 304 in FIG. 4). Touch and force-sensitive button 700 can include a force sensor 701 (e.g., corresponding to force sensor 301) and a touch sensor 709. As illustrated in FIG. 7A, force sensor 701 can be a capacitive-gap sensor including a drive layer 710 and a sense layer 712 separated by gap 714. Sense layer 712 can be coupled to stiffener 704 and drive layer 710 can be part of a drive stack coupled to cover glass 702 and/or touch and/or force controller 708. Touch and force-sensitive button 700 can also include a touch and/or force controller 708 coupled to cover glass 702. Touch and/or force controller 708 can be an integrated circuit including a temperature sensor. The touch sensor 709 and drive layer 710 can together be referred to as the drive stack. The temperature sensor can measure the temperature of the drive stack including drive layer 710 of force sensor 701.

Cover glass 702 and stiffer 704 can be separated from one another by trim 703 and pads 706. Trim 703 can form the sides of touch and force-sensitive button 700. To maintain the air gap and seal the touch and/or force sensors from liquids, touch and force-sensitive button 700 can include seals 705 between pads 706 and cover glass 702. Trim 703 can also provide part of the seal. Touch and force-sensitive button 700 can be mounted to or in an electronic device (e.g., mobile telephone 136, digital media player 140, personal computer 144, tablet computing device 148, wearable device) by welds 707 through stiffener 704 and to trim 703.

As illustrated in FIG. 7A, when an object such as finger 718 contacts cover glass 702 of touch and force-sensitive button 700, heat flux from finger 718 into touch and force-sensitive button 700 can cause thermal drift effects described herein.

FIG. 7B illustrates an exemplary thermal circuit model for a touch and force-sensitive button according to examples of the disclosure. Thermal circuit model 750 can correspond to the exemplary touch and force-sensitive button of FIG. 7A. As discussed above, components of touch and force-sensitive button 700 can be modeled by their thermal impedances. For example, thermal circuit model 750 can model finger 718 in contact with touch and force-sensitive button 700 with $R_{FINGER}$ and $C_{FINGER}$. Likewise, thermal circuit model 750 can model cover glass 702 with $R_{CG}$ and $C_{CG}$, trim 703 with $R_{TRIM}$ and $C_{TRIM}$, pads 706 with $R_{PAD/2}$, $R_{PAD/2}$ and $C_{PAD}$, touch/force controller 708 with $R_{ASIC}$ and $C_{ASIC}$, drive stack (including touch sensor 709 and drive layer 710) with $R_{DRIVESTACK}$ and $C_{DRIVESTACK}$, sense layer 712 with $R_{SENSE}$ and $C_{SENSE}$, and remaining system capacitance with respect to ground with $C_{SYSTEM}$. As described above, thermal circuit model 750 can be simplified and simulated to generate a thermal transfer function for use in thermal compensation.

It should be understood that in some examples, the force-sensitive input device (e.g., force-sensitive button) can be configured as illustrated and described in U.S. patent application Ser. No. 15/087,306 ("FORCE SENSOR IN AN INPUT DEVICE", Kim et al.), filed Mar. 31, 2016, the entire disclosure of which is incorporated by reference herein for all purposes.

Although described herein primarily in terms of capacitive-gap sensors, it should be understood that the thermal compensation described herein can be applied to force measurements from other force sensors affected by thermal drift (e.g., in which a thermal component changes the properties of the sensor in an undesirable manner). Additionally, although described herein primarily in terms of removing temperature drift in the gap domain (e.g., as in FIG. 5), it should be understood that the temperature drift can alternatively be removed in the capacitance domain or in the force domain.

Therefore, according to the above, some examples of the disclosure are directed to an electronic device. The electronic device can comprise a force-sensitive button and one or more processors coupled to the force-sensitive input button. The force sensitive button can comprise: a force sensor configured to measure an amount of force applied to the force-sensitive button; and a temperature sensor coupled proximate to the force sensor and configured to measure a temperature associated with the force sensor. The one or more processors can be capable of: compensating the amount of force measured by the force sensor based on the temperature associated with the force sensor measured by the temperature sensor. Additionally or alternatively to one or more of the examples disclosed above, in some examples, the force sensor can be a capacitive force sensor including one or more first electrodes and one or more second electrodes. A change in a gap between the one or more first electrodes and the one or more second electrodes due to the amount of applied force can change a capacitance formed between the one or more first electrodes and the one or more second electrodes. Additionally or alternatively to one or more of the examples disclosed above, in some examples, the force-sensitive button can further comprise a touch sensor configured to detect an object touching a surface of the force-sensitive button; and the one or more processors can be capable of compensating the amount of force in response to detecting the object touching the surface of the force-sensitive button. Additionally or alternatively to one or more of the examples disclosed above, in some examples, in response to detecting the object touching the surface of the force-sensitive button, a scanning rate of the temperature sensor can increase relative to a scanning rate of the temperature sensor without detecting the object. Additionally or alternatively to one or more of the examples disclosed above, in some examples, in response to detecting the object touching the surface of the force-sensitive button, a scanning rate of the force sensor can increase relative to a scanning rate of the force sensor without detecting the object. Additionally or alternatively to one or more of the examples disclosed above, in some examples, compensating the amount of force measured by the force sensor based on the temperature associated with the force sensor measured by the temperature sensor can comprise: measuring a capacitance formed between one or more first electrodes and one or more second electrodes of the force sensor; determining a measured gap based on the measured capacitance; determining an estimated gap associated with a temperature change introduced into the force-sensitive button by the object touching the surface of the force-sensitive button based on the temperature associated with the force sensor measured by the temperature sensor; determining a compensated gap by subtracting the estimated gap from the measured gap; and determining the compensated amount of force based on the compensated gap. Additionally or alternatively to one or more of the examples disclosed above, in some examples, the estimated gap associated with the temperature change can be determined by applying a thermal transfer function for the force-sensitive button to the temperature change. Additionally or alternatively to one or more of the examples disclosed above, in some examples, the force-sensitive button can further comprise: a second temperature sensor configured to measure a temperature associated with the force-sensitive button. The one or more processors can be further capable of: compensating the amount of force measured by the force sensor based on the temperature associated with the force-sensitive button measured by the second temperature sensor. Additionally or alternatively to one or more of the examples disclosed above, in some examples, the force-sensitive button can further comprise: a compressible pad between a first substrate and a second substrate; and a second temperature sensor coupled proximate to the compressible pad and configured to measure a temperature associated with the compressible pad. The one or more processors can be further capable of: compensating the amount of force measured by the force sensor based on the temperature associated with the compressible pad measured by the second temperature sensor.

Some examples of the disclosure are directed to a method for compensating force measurements. The method can comprise: measuring, with a force sensor, an amount of force applied to a force-sensitive button; measuring a temperature associated with the force sensor; and compensating the amount of force measured by the force sensor based on the temperature associated with the force sensor. Additionally or alternatively to one or more of the examples disclosed above, in some examples, the method can further comprise: detecting an object touching a surface of the force-sensitive button. Compensating the amount of force can occur in response to detecting the object touching the surface of the force-sensitive button. Additionally or alternatively to one or more of the examples disclosed above, in some examples, the method can further comprise increasing, in response to detecting the object touching the surface of the force-sensitive button, a rate of measuring the temperature associated with the force sensor relative to a rate of measuring the temperature associated with the force sensor without detecting the object. Additionally or alternatively to one or more of the examples disclosed above, in some examples, compensating the amount of force measured by the force sensor based on the temperature associated with the force sensor can comprise: measuring a capacitance formed between one or more first electrodes and one or more second electrodes of the force sensor; determining a measured gap based on the measured capacitance; determining an estimated gap associated with a temperature change introduced into the force-sensitive button by the object touching the surface of the force-sensitive button based on the temperature associated with the force sensor; determining a compensated gap by subtracting the estimated gap from the measured gap; and determining the compensated amount of force based on the compensated gap. Additionally or alternatively to one or more of the examples disclosed above, in some examples, the estimated gap associated with the temperature change can be determined by applying a thermal transfer function for the force-sensitive button to the temperature change. Additionally or alternatively to one or more of the examples disclosed above, in some examples, the thermal transfer function can be a first order transfer function. Additionally or alternatively to one or more of the examples disclosed above, in some examples, the thermal transfer function can be a second order transfer function. Some examples of the disclosure are directed to a non-transitory computer-readable medium including instructions, which when executed by one or more processors, cause the one or more processors to perform any of the above methods.

Some examples of the disclosure are directed to a non-transitory computer-readable medium. The non-transitory computer-readable medium can include instructions, which when executed by one or more processors, cause the one or more processors to perform a method for compensating force measurements. The method can comprise: detecting, with a touch sensor, an object touching a surface of the force-sensitive button; measuring, with a force sensor, an amount of force applied to a force-sensitive button by the object; measuring a temperature associated with the force sensor; in accordance with detecting the object touching the surface of the force-sensitive button, compensating the amount of force measured by the force sensor based on the temperature associated with the force sensor; and in accordance with detecting no object touching the surface of the force-sensitive button, forgoing compensating the amount of force measured by the force sensor based on the temperature associated with the force sensor. Additionally or alternatively to one or more of the examples disclosed above, in some examples, compensating the amount of force measured by the force sensor based on the temperature associated with the force sensor can comprise: measuring a capacitance formed between one or more first electrodes and one or more second electrodes of the force sensor; determining a measured gap based on the measured capacitance; determining an estimated gap associated with a temperature change introduced into the force-sensitive button by the object touching the surface of the force-sensitive button based on the temperature associated with the force sensor; determining a compensated gap by subtracting the estimated gap from the measured gap; and determining the compensated amount of force based on the compensated gap. Additionally or alternatively to one or more of the examples disclosed above, in some examples, the estimated gap associated with the temperature change can be determined by applying a thermal transfer function for the force-sensitive button to the temperature change. Additionally or alternatively to one or more of the examples disclosed above, in some examples, the thermal transfer function can be a first order transfer function. Additionally or alternatively to one or more of the examples disclosed above, in some examples, the thermal transfer function can be a second order transfer function.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

The invention claimed is:

1. An electronic device comprising:
 a force-sensitive button comprising:
  a touch sensor configured to detect an object touching a surface of the force-sensitive button;
  a force sensor configured to measure an amount of force applied to the surface of the force-sensitive button by the object, the force sensor including one or more first electrodes and one or more second electrodes, wherein a change in a gap between the one or more first electrodes and the one or more second electrodes due to the amount of applied force changes a capacitance between the one or more first electrodes and the one or more second electrodes; and
  a temperature sensor coupled proximate to the force sensor and configured to measure a temperature associated with the force sensor; and
 one or more processors coupled to the force-sensitive button and configured to respond to a detection of the object touching the surface of the force-sensitive button by:
  compensating the amount of force measured by the force sensor based on the temperature associated with the force sensor measured by the temperature sensor;
 wherein, at least one of: a scanning rate of the temperature sensor increases relative to a scanning rate of the temperature sensor without detecting the object, or a scanning rate of the force sensor increases relative to a scanning rate of the force sensor without detecting the object.

2. The electronic device of claim 1, wherein compensating the amount of force measured by the force sensor based on the temperature associated with the force sensor measured by the temperature sensor comprises:
 measuring the capacitance formed between the one or more first electrodes and the one or more second electrodes of the force sensor;
 determining a measured change in the gap based on the measured capacitance;
 determining an estimated gap associated with a temperature change introduced into the force-sensitive button by the object touching the surface of the force-sensitive button based on the temperature associated with the force sensor measured by the temperature sensor;
 determining a compensated gap by subtracting the estimated gap from the measured change in the gap; and
 determining the compensated amount of force based on the compensated gap.

3. The electronic device of claim 2, wherein the estimated gap associated with the temperature change is determined by applying a thermal transfer function for the force-sensitive button to the temperature change.

4. The electronic device of claim 1, wherein the force-sensitive button further comprises:

a second temperature sensor configured to measure a temperature associated with the force-sensitive button;

wherein the one or more processors are further capable of:
compensating the amount of force measured by the force sensor based on the temperature associated with the force-sensitive button measured by the second temperature sensor.

5. A method for compensating force measurements, the method comprising:
detecting an object touching a surface of a force-sensitive button;
measuring, with a force sensor, an amount of force applied to the surface of the force-sensitive button by the object, the force sensor including one or more first electrodes and one or more second electrodes, wherein a change in a gap between the one or more first electrodes and the one or more second electrodes due to the amount of applied force changes a capacitance between the one or more first electrodes and the one or more second electrodes;
measuring a temperature associated with the force sensor; and
in response to detecting the object touching the surface of the force-sensitive button, compensating the amount of force measured by the force sensor based on the temperature associated with the force sensor;
wherein compensating the amount of force measured by the force sensor based on the temperature associated with the force sensor comprises:
measuring the capacitance formed between the one or more first electrodes and the one or more second electrodes of the force sensor;
determining a measured change in the gap based on the measured capacitance;
determining an estimated gap associated with a temperature change introduced into the force-sensitive button by the object touching the surface of the force-sensitive button based on the temperature associated with the force sensor;
determining a compensated gap by subtracting the estimated gap from the measured change in the gap; and
determining the compensated amount of force based on the compensated gap.

6. The method of claim 5, further comprising:
increasing, in response to detecting the object touching the surface of the force-sensitive button, a rate of measuring the temperature associated with the force sensor relative to a rate of measuring the temperature associated with the force sensor without detecting the object.

7. The method of claim 5, wherein the estimated gap associated with the temperature change is determined by applying a thermal transfer function for the force-sensitive button to the temperature change.

8. The method of claim 7, wherein the thermal transfer function is a first order transfer function.

9. The method of claim 7, wherein the thermal transfer function is a second order transfer function.

10. A non-transitory computer readable storage medium storing instructions, which when executed by one or more processors, cause the one or more processors to perform a method for compensating force measurements, the method comprising:
detecting, with a touch sensor, an object touching a surface of a force-sensitive button;
measuring, with a force sensor, an amount of force applied to the force-sensitive button by the object, the force sensor including one or more first electrodes and one or more second electrodes, wherein a change in a gap between the one or more first electrodes and the one or more second electrodes due to the amount of applied force changes a capacitance between the one or more first electrodes and the one or more second electrodes;
measuring a temperature associated with the force sensor;
in accordance with detecting the object touching the surface of the force-sensitive button, compensating the amount of force measured by the force sensor based on the temperature associated with the force sensor; and
in accordance with detecting no object touching the surface of the force-sensitive button, forgoing compensating the amount of force measured by the force sensor based on the temperature associated with the force sensor;
wherein compensating the amount of force measured by the force sensor based on the temperature associated with the force sensor comprises:
measuring the capacitance formed between the one or more first electrodes and the one or more second electrodes of the force sensor;
determining a measured change in the gap based on the measured capacitance;
determining an estimated gap associated with a temperature change introduced into the force-sensitive button by the object touching the surface of the force-sensitive button based on the temperature associated with the force sensor;
determining a compensated gap by subtracting the estimated gap from the measured change in the gap; and
determining the compensated amount of force based on the compensated gap.

11. The non-transitory computer readable storage medium of claim 10, wherein the estimated gap associated with the temperature change is determined by applying a thermal transfer function for the force-sensitive button to the temperature change.

12. The non-transitory computer readable storage medium of claim 11, wherein the thermal transfer function is a first order transfer function.

13. The non-transitory computer readable storage medium of claim 11, wherein the thermal transfer function is a second order transfer function.

* * * * *